United States Patent
Brandon

(10) Patent No.: US 7,297,621 B2
(45) Date of Patent: Nov. 20, 2007

(54) FLEXIBLE CARBON-BASED OHMIC CONTACTS FOR ORGANIC TRANSISTORS

(75) Inventor: Erik Brandon, Pasadena, CA (US)

(73) Assignee: California Institute of Technology, Pasadena, CA (US)

( * ) Notice: Subject to any disclaimer, the term of this patent is extended or adjusted under 35 U.S.C. 154(b) by 0 days.

(21) Appl. No.: 10/826,140

(22) Filed: Apr. 15, 2004

(65) Prior Publication Data

US 2005/0277234 A1    Dec. 15, 2005

Related U.S. Application Data

(60) Provisional application No. 60/463,064, filed on Apr. 15, 2003.

(51) Int. Cl.
*H01L 21/3205* (2006.01)
*H01L 21/4763* (2006.01)

(52) U.S. Cl. .......................... 438/586; 438/99; 257/40

(58) Field of Classification Search .................. 438/99, 438/197, 586, 597; 257/40, 288
See application file for complete search history.

(56) References Cited

U.S. PATENT DOCUMENTS

| | | |
|---|---|---|
| 3,627,655 A | 12/1971 | Perez-Albuerne |
| 3,754,986 A | 8/1973 | Perez-Albuerne |
| 3,844,843 A | 10/1974 | Kay et al. |
| 3,900,945 A | 8/1975 | Kay et al. |
| 3,916,267 A | 10/1975 | Yasuda et al. |
| 3,946,289 A | 3/1976 | Yasuda |
| 3,963,498 A | 6/1976 | Trevoy |
| 4,025,342 A | 5/1977 | Trevoy |
| 4,025,463 A | 5/1977 | Trevoy |
| 4,025,691 A | 5/1977 | Trevoy |
| 4,025,704 A | 5/1977 | Trevoy |
| 4,572,900 A | 2/1986 | Wohltjen |
| 4,590,541 A | 5/1986 | Takahashi et al. |
| 4,656,560 A | 4/1987 | Ito et al. |
| 4,735,823 A | 4/1988 | Ito et al. |
| 4,987,430 A | 1/1991 | Clarisse et al. |
| 5,107,308 A | 4/1992 | Ando et al. |
| 5,117,333 A | 5/1992 | Kakuma et al. |
| 5,220,181 A | 6/1993 | Kanai et al. |
| 5,287,421 A | 2/1994 | Forrest et al. |
| 5,499,981 A | 3/1996 | Kordis |
| 5,596,208 A | 1/1997 | Dodabalapur et al. |

(Continued)

FOREIGN PATENT DOCUMENTS

EP      0152082 A2    8/1985

(Continued)

OTHER PUBLICATIONS

Donev, Eugene, "Designing and implementing organic thin-film transistors (OTFTs)," University of the South, Sep. 2002, The Economist. 2002. More Over, Silicon. Dec. 12, 2002.

(Continued)

*Primary Examiner*—Phuc T. Dang
(74) *Attorney, Agent, or Firm*—Tope-McKay & Associates

(57) ABSTRACT

The present invention relates to a system and method of organic thin-film transistors (OTFTs). More specifically, the present invention relates to employing a flexible, conductive particle-polymer composite material for ohmic contacts (i.e. drain and source).

27 Claims, 4 Drawing Sheets

U.S. PATENT DOCUMENTS

| | | | |
|---|---|---|---|
| 5,629,530 | A | 5/1997 | Brown et al. |
| 5,661,405 | A | 8/1997 | Simon et al. |
| 5,711,897 | A | 1/1998 | Havelka et al. |
| 5,879,582 | A | 3/1999 | Havelka et al. |
| 5,936,259 | A | 8/1999 | Katz et al. |
| 5,946,551 | A | 8/1999 | Dimitrakopoulos et al. |
| 5,957,854 | A | 9/1999 | Besson et al. |
| 5,969,376 | A | 10/1999 | Bao |
| 5,981,970 | A | 11/1999 | Dimitrakopoulos et al. |
| 5,991,655 | A | 11/1999 | Gross et al. |
| 6,024,702 | A | 2/2000 | Iversen |
| 6,037,718 | A | 3/2000 | Nagami |
| 6,087,196 | A | 7/2000 | Sturm et al. |
| 6,107,117 | A | 8/2000 | Bao et al. |
| 6,111,902 | A | 8/2000 | Kozlov et al. |
| 6,150,191 | A | 11/2000 | Bao |
| 6,194,837 | B1 | 2/2001 | Ozawa |
| 6,207,034 | B1 | 3/2001 | Madden et al. |
| 6,235,559 | B1 | 5/2001 | Kuo |
| 6,278,127 | B1 * | 8/2001 | Dodabalapur et al. ........ 257/40 |
| 6,300,612 | B1 | 10/2001 | Yu |
| 6,303,316 | B1 | 10/2001 | Kiel et al. |
| 6,326,640 | B1 | 12/2001 | Shi et al. |
| 6,330,262 | B1 | 12/2001 | Burrows et al. |
| 6,335,539 | B1 | 1/2002 | Dimitrakopoulos et al. |
| 6,344,660 | B1 | 2/2002 | Dimitrakopoulos et al. |
| 6,362,509 | B1 | 3/2002 | Hart |
| 6,396,860 | B1 | 5/2002 | Kozlov et al. |
| 6,403,397 | B1 | 6/2002 | Katz |
| 6,452,207 | B1 | 9/2002 | Bao |
| 6,484,559 | B2 | 11/2002 | Dodabalapur et al. |
| 6,545,290 | B2 | 4/2003 | Lorin et al. |
| 6,815,286 | B2 * | 11/2004 | Krieger et al. ............. 438/238 |
| 2002/0003201 | A1 | 1/2002 | Yu |
| 2002/0045289 | A1 | 4/2002 | Dimitrakopoulos et al. |
| 2002/0116982 | A1 | 8/2002 | Dodabalapur et al. |
| 2002/0117693 | A1 | 8/2002 | Dodabalapur et al. |
| 2002/0135039 | A1 | 9/2002 | Yang |
| 2002/0149010 | A1 | 10/2002 | Wakimoto et al. |
| 2002/0171125 | A1 | 11/2002 | Bao et al. |
| 2002/0179901 | A1 | 12/2002 | Arai et al. |
| 2003/0001494 | A1 | 1/2003 | Wakimoto et al. |
| 2003/0010973 | A1 | 1/2003 | Lorin et al. |
| 2003/0015805 | A1 | 1/2003 | Wakimoto et al. |
| 2003/0027970 | A1 | 2/2003 | Haasmann et al. |
| 2003/0228718 | A1 * | 12/2003 | Murti et al. ................. 438/99 |
| 2004/0161873 | A1 * | 8/2004 | Dimitrakopoulos et al. .. 438/99 |

FOREIGN PATENT DOCUMENTS

| | | | |
|---|---|---|---|
| EP | 0152082 | B1 | 5/1989 |
| EP | 0316230 | | 5/1989 |
| EP | 0418504 | B1 | 3/1991 |
| EP | 0418504 | A2 | 4/1995 |
| EP | 0464605 | B1 | 12/1995 |
| EP | 0699743 | A2 | 3/1996 |
| EP | 0708987 | | 5/1996 |
| EP | 0719108 | | 7/1996 |
| EP | 0699743 | A3 | 9/1996 |
| EP | 0786820 | A2 | 7/1997 |
| EP | 0716458 | | 11/1997 |
| EP | 0825657 | | 4/1998 |
| EP | 0786820 | A3 | 7/1998 |
| EP | 0852403 | | 7/1998 |
| EP | 0968538 | | 1/2000 |
| EP | 1029369 | A1 | 8/2000 |
| EP | 1051738 | | 11/2000 |
| EP | 1051752 | A2 | 11/2000 |
| EP | 1183287 | | 3/2002 |
| EP | 1198851 | | 4/2002 |
| EP | 1246270 | A2 | 10/2002 |
| EP | 1246271 | A2 | 10/2002 |
| EP | 1251720 | A2 | 10/2002 |
| EP | 1263062 | A2 | 12/2002 |
| EP | 1306909 | | 5/2003 |
| EP | 1306910 | | 5/2003 |
| WO | WO9421169 | | 9/1994 |
| WO | WO9507048 | | 3/1995 |
| WO | WO9531833 | | 11/1995 |
| WO | WO9621659 | A1 | 7/1996 |
| WO | WO9706649 | | 2/1997 |
| WO | WO98/21755 | | 5/1998 |
| WO | WO9835393 | | 8/1998 |
| WO | WO9839057 | | 9/1998 |
| WO | WO9921233 | A1 | 4/1999 |
| WO | WO9939372 | A2 | 8/1999 |
| WO | WO9939373 | | 8/1999 |
| WO | WO0069931 | A1 | 11/2000 |
| WO | WO0106249 | | 1/2001 |
| WO | WO0108241 | | 2/2001 |
| WO | WO0194980 | | 12/2001 |
| WO | WO 02/05294 | | 1/2002 |
| WO | WO0221603 | | 3/2002 |
| WO | WO0221611 | | 3/2002 |
| WO | WO0221613 | | 3/2002 |
| WO | WO0227811 | | 4/2002 |
| WO | WO0243044 | | 5/2002 |
| WO | WO0250926 | A3 | 6/2002 |
| WO | WO02061837 | | 8/2002 |
| WO | WO02072714 | | 9/2002 |
| WO | WO03016599 | | 2/2003 |
| WO | WO03019631 | | 3/2003 |
| WO | WO03019693 | | 3/2003 |
| WO | WO03019694 | | 3/2003 |
| WO | WO03029354 | | 4/2003 |

OTHER PUBLICATIONS

Klauk, Hagen and Thomas N. Jackson, "Deposition: pentacene organic thin-film transistors and ICs," Solid State Technology, Mar. 2000.

Lawton, Stephen, "Back to the future," Electronic Business, 2002.

Lucent Technologies, Lucent Licenses Bell Labs Technology for 'Electronic Paper,' Bell Labs Innovations, Jun. 12, 2000.

Lucent Technologies, Bell Labs scientists usher in new era of molecular-scale electronics, Bell Labs Innovations, Oct. 17, 2001.

Merritt, Rich, "Strategists say the future belongs to those who focus on connectivity," VDC Corporation, 2002.

Peercy, P.S. Undated, University of Wisconsin, Electronic Systems, 1998.

Thin Film Manufacturing, Organic semiconductors create new markets, Feb. 20, 2003.

United States Display Consortium, Display Trends, Spring 2002.

Wang, J., D. J. Gundlach, C. C. Kuo, and T. N. Jackson, "Improved Contacts for Organic Eelctronic Devices Using Self-Assembled Charge Transfer Materials," 41st Electronic Materials Conference Digest, p. 16, Jun. 1999.

* cited by examiner

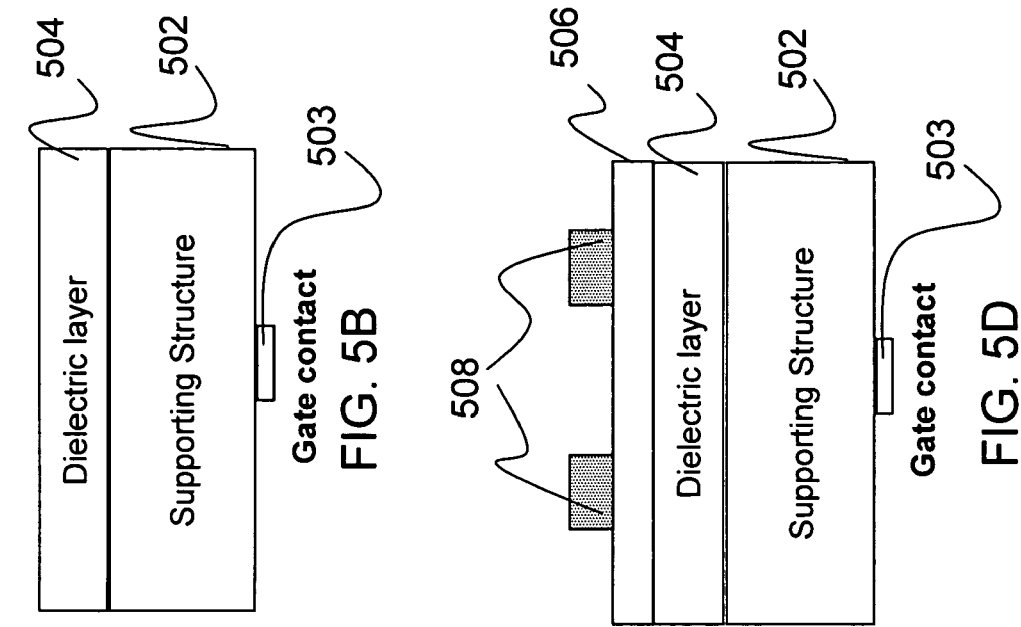
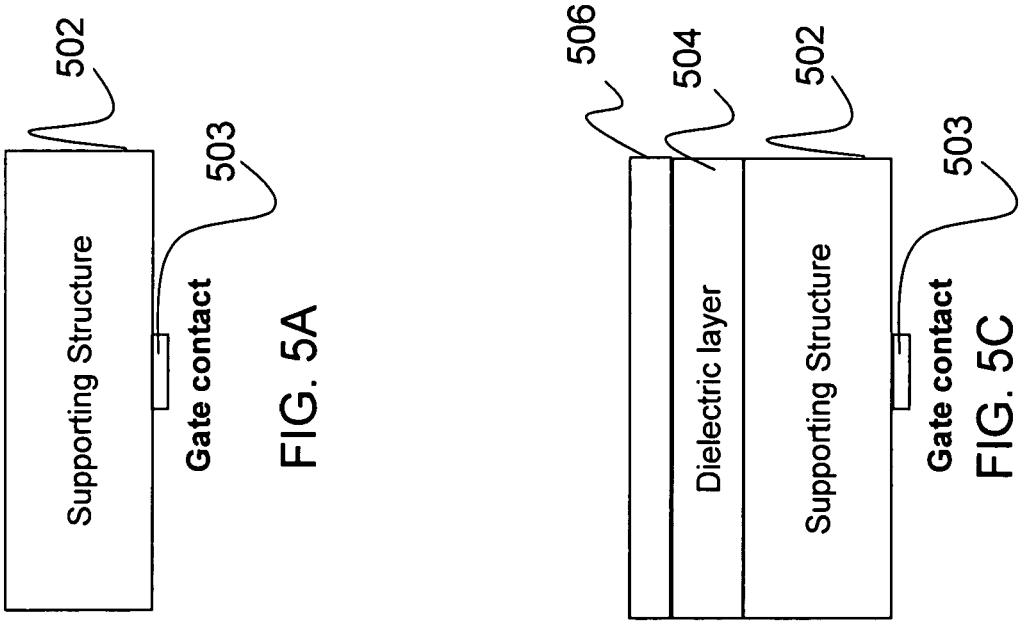

FLEXIBLE CARBON-BASED OHMIC CONTACTS FOR ORGANIC TRANSISTORS

PRIORITY CLAIM

The present application claims the benefit of priority of U.S. Provisional Patent Application No. 60/463,064, filed Apr. 15, 2003 and entitled "Flexible Carbon-Based Ohmic Contracts for Organic Transistors."

STATEMENT OF GOVERNMENT INTEREST

This invention described herein was made in the performance of work under a NASA contract, and is subject to the provisions of Public Law 96-517 (35 USC 202) in which the Contractor has elected to retain title.

BACKGROUND OF THE INVENTION (1) Technical Field

The present invention relates to a system and method of fabricating organic thin-film transistors (OTFTs). More specifically, the present invention relates to the employment of a flexible, conductive particle-polymer composite material for ohmic contacts (i.e. drain and source).

(2) Description of Related Art

Organic electronics have recently attracted tremendous interest within the microelectronics industry for potential use in a wide range of commercial applications, such as large area flexible displays as well as other consumer electronics applications including smart cards, radio frequency identification (RFID) tags and electronic paper. This technology utilizes molecular and polymeric semiconducting compounds in place of traditional materials such as silicon. Thin-film transistors (TFTs) and organic light-emitting diodes (OLEDs) can be fabricated from different organic and polymeric compounds using a variety of low-temperature, low-cost processing techniques including solution casting, spin coating and ink jet printing.

Steady improvements in materials and processes over the last few years have brought the performance of organic-TFT (OTFT) devices in line with that of amorphous silicon devices. Unlike amorphous silicon, however, the organic semiconducting layers can be deposited at room temperature, allowing the organic semiconducting layers to be printed directly onto heat-sensitive structures. These TFTs can be used in applications where low-cost or mechanical flexibility is required.

Beyond the aforementioned commercial applications, development of robust organic electronics for extreme environmental conditions is also of interest for space and military applications. Possible applications to human exploration of space include flexible displays, flexible health sensing electronics, and chemical/biological sensing electronics which could be incorporated into protective clothing. Potential applications for robotic missions include distributed sensors for large area surface diagnostics and metrology on inflatable/deployable structures. Examples of distributed sensors include temperature sensors, strain sensors, shape sensors, tear detection sensors or even sensors to control piezoelectric actuators. In the case of sensors distributed on large-area surfaces of inflatable/deployable structures, integration of rigid silicon-based chips within such a structure is impractical due to problems with assembly, die thinning, mechanical stresses, thermal mismatch and die attach. For these applications, very high-density electronics are not required (due to the very large areas available) and could benefit from the integration of flexible (OTFT) based sensor and sensor electronics.

Previous work in the area of organic transistors has focused on the use of either 1) vacuum-deposited noble metal contacts or 2) solution-deposited intrinsically conducting molecular or polymeric contacts to the form the drain and source contacts.

Use of vacuum-deposited noble metal contacts, such as gold or platinum, obviates one of the main benefits of organic electronics, i.e., low-cost processing based on solution or printing techniques. Vacuum deposition requires the use of techniques, such as sputtering or evaporation, instead of less expensive solution-based processes such as spin coating, casting or printing. Second, the use of gold or platinum for coating large area devices is potentially expensive, both from a stand point of materials and processing equipment. Again, this approach runs counter to the perceived low-cost benefit of organic electronics. Furthermore, the adhesion of gold to many organic materials is very poor.

Some recent work has been carried out regarding intrinsically conducting molecular-based or polymeric-based contacts such as polyaniline and TTF-TCNQ, examples of such work include C. J. Druru, C. M. J. Mutsaers, C. M. Hart, et al., "Low-cost All-polymer Integrated Circuits, Applied Physics Letters, vol. 73, pp. 108-110, July 1998 and K. Saito and S. Kobayashi, "Deposition of Organic Electrodes Based on Wet Process for Organic Devices," Applied Physics Letters, vol. 80, pp. 1489-1491, February 2002. Unfortunately, these materials tend to exhibit high resistivities and poor overall performance, are prone to reaction with the surrounding environment, and are potentially unstable over time.

Within the field of organic electronics, the search continues for molecular and polymeric semiconducting materials, which are soluble in common solvents, stable under ambient conditions and exhibit high carrier mobilities. In addition, within the field of organic electronics, studies are being conducted regarding materials that can be used as the gate dielectric and as the drain and source contact layers for organic-thin-film transistor (OTFT) devices. The drain and source contacts are particularly critical, as they form a direct ohmic contact with the organic semiconductor. Furthermore, it is desirable that these contacts be stable over time with respect to the semiconductor and dielectric interfaces as well as the ambient environment, particularly when biased at high voltages (up to a 100 V differential between drain/source and source/gate). Finally, for many emerging applications, it is desirable that these contacts be flexible, and may be able to be processed at low temperatures while maintaining adequate adhesion to the underlying substrate.

To achieve an ohmic contact to the organic semiconductor, the work function of the contact should be well matched to that of the semiconductor. Previous work has focused on the use of noble metal contacts and conducting polymers to form these contacts. However, this type of processing can be expensive and can result in poor quality devices. What are needed are contacts which are inexpensive, flexible, stable, form ohmic contacts to common organic semiconductors, and can be readily processed without the need for expensive processing equipment, such as vacuum deposition equipment.

SUMMARY OF THE INVENTION

The present invention provides a system and a method that overcomes the aforementioned limitations and fills the aforementioned needs by utilizing a polymer composite having a conducting filler that adheres to the organic semiconductor.

In one aspect of the invention, an active device is formed by acts of: depositing a dielectric layer on a substrate; placing a polymer composite over at least a portion of the dielectric layer to form drain and source contacts, the polymer composite having a conducting filler; and forming an organic semiconductor layer over at least a portion of the polymer composite, the organic semiconductor layer providing a channel between the drain and source contacts.

The forming of the active device is further characterized by forming the organic semiconductor layer through acts of: dissolving an organic semiconductor in a solvent forming a semiconductor solution; depositing the semiconductor solution over at least a portion of the polymer composite; and evaporating the solvent from the semiconductor solution such that the organic semiconductor layer remains.

In another embodiment, flexible contacts are formed by acts of: forming a first contact pattern on a supporting structure; depositing a dielectric layer on the supporting structure; depositing a polymer composite having a conducting filler to form a second contact pattern connected with dielectric layer; and providing an organic semiconductor layer for connecting a first portion of the second contact pattern with a second portion of the second contact pattern.

In yet another embodiment, a flexible ohmic contact is disclosed comprising: a supporting structure including a first contact pattern; a dielectric layer disposed on the supporting structure; a polymer composite connected with the dielectric layer, the polymer composite providing a second contact pattern, the second contact pattern having a first portion and a second portion, where the first portion and the second portion are separated by a distance; and an organic semiconductor layer connected with the dielectric layer, the organic semiconductor layer allowing for an electrical connection between the first portion and the second portion of the second contact pattern.

BRIEF DESCRIPTION OF THE DRAWINGS

The objects, features and advantages of the present invention will be apparent from the following detailed descriptions of the preferred aspect of the invention in conjunction with reference to the following drawings.

FIGS. 5A-5D depict one process by which a top contact device may be fabricated in accordance with the present invention.

DETAILED DESCRIPTION

The present invention relates to employing a flexible, conductive particle-polymer composite material for ohmic contacts (i.e. drain and source). The following description, taken in conjunction with the referenced drawings, is presented to enable one of ordinary skill in the art to make and use the invention and to incorporate it in the context of particular applications. Various modifications, as well as a variety of uses in different applications, will be readily apparent to those skilled in the art, and the general principles, defined herein, may be applied to a wide range of embodiments. Thus, the present invention is not intended to be limited to the embodiments presented, but is to be accorded the widest scope consistent with the principles and novel features disclosed herein. Furthermore, it should be noted that unless explicitly stated otherwise, the figures included herein are illustrated diagrammatically and without any specific scale, as they are provided as qualitative illustrations of the concept of the present invention.

(1) Introduction

In the following detailed description, numerous specific details are set forth in order to provide a more thorough understanding of the present invention. However, it will be apparent to one skilled in the art that the present invention may be practiced without necessarily being limited to these specific details. In other instances, well-known structures and devices are shown in block diagram form, rather than in detail, in order to avoid obscuring the present invention.

The reader's attention is directed to all papers and documents which are filed concurrently with this specification and which are open to public inspection with this specification, and the contents of all such papers and documents are incorporated herein by reference. All the features disclosed in this specification, (including any accompanying claims, abstract, and drawings) may be replaced by alternative features serving the same, equivalent or similar purpose, unless expressly stated otherwise. Thus, unless expressly stated otherwise, each feature disclosed is one example only of a generic series of equivalent or similar features.

Furthermore, any element in a claim that does not explicitly state "means for" performing a specified function, or "step for" performing a specific function, is not to be interpreted as a "means" or "step" clause as specified in 35 U.S.C. Section 112, Paragraph 6. In particular, the use of "step of" or "act of" in the claims herein is not intended to invoke the provisions of 35 U.S.C. 112, Paragraph 6.

The description outlined below sets forth a system and method for forming contacts on organic semiconductors without the need for expensive processing such as vacuum deposition.

(2) Details

Figure 1:
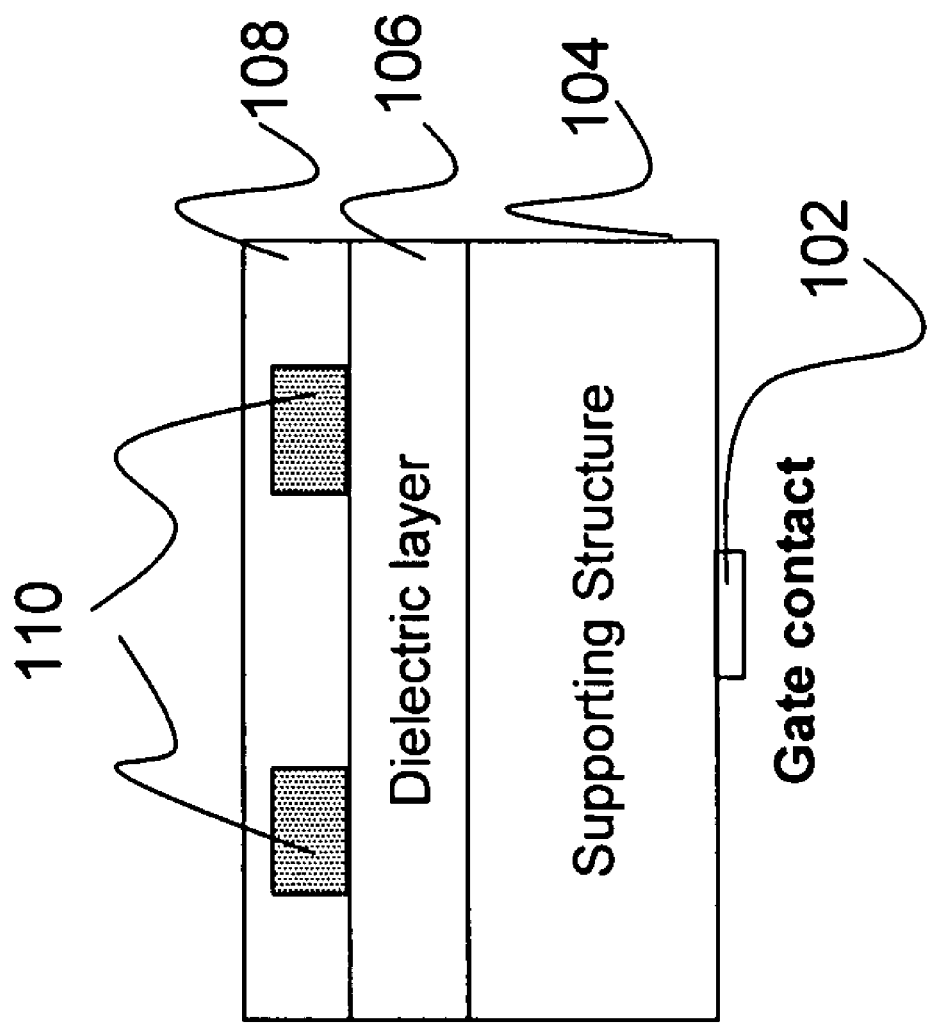
FIG. 1 depicts a bottom contact thin-film transistor geometry in accordance with the present invention.

A bottom contact thin-film transistor geometry in accordance with the present invention is shown in FIG. 1. The bottom contact thin-film transistor comprises a gate contact 102, a supporting structure 104, a dielectric layer 106, an organic semiconductor layer 108, and drain/source contacts 110. One skilled in the art will appreciate that the polymer composite 110 may be deposited in an atmosphere, and not in a vacuum as is required for sputtering and vacuum deposition techniques. The following description and diagrams provide the reader with one method of producing a thin-film transistor geometry in accordance with the present invention. One skilled in the art will appreciate that there are other methods of manufacturing which could be used to arrive at the same result.

Figure 2B:
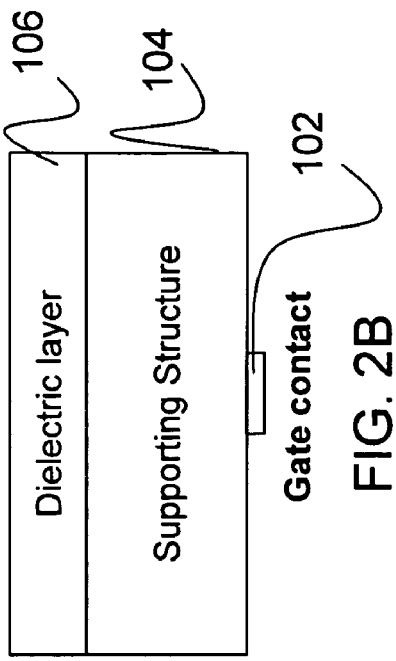
FIGS. 2A-2C depict parts of the fabrication of the bottom contact thin-film transistor geometry in accordance with the present invention.
Figure 2C:
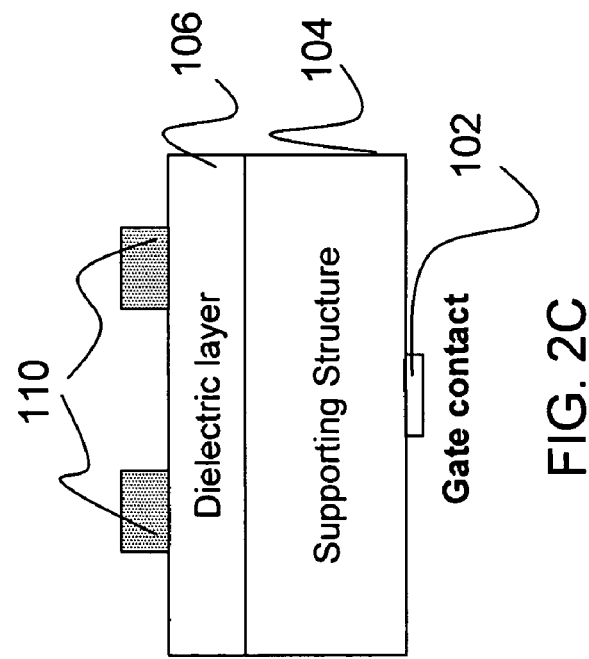
Figure 2A:
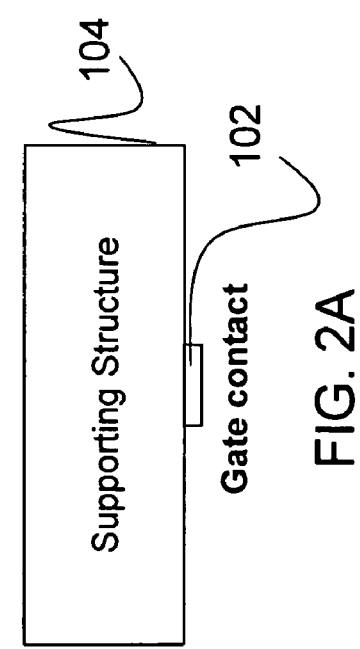

FIG. 2A depicts the first part of the fabrication of the bottom contact thin-film transistor geometry in accordance with the present invention. In one embodiment, the supporting structure 104 is a highly boron-doped silicon wafer with a resistivity of 0.001-0.005 Ω-cm, which was procured from Virginia Semiconductor (Fredericksburg, Va.). The wafer acts not only as a supporting structure 104, but also provides the gate contact 102 to the dielectric by virtue of its low resistivity. This supporting structure could also be comprised of other rigid materials such as glass or a ceramic, or could be a flexible substrate such as a polyester or a polyimide-based material. When non-conducting support structures such as these are employed, a metallized gate contact would need to be added.

FIG. 2B depicts the second part of the fabrication of the bottom contact thin-film transistor geometry. An oxide gate dielectric layer 106 is deposited or grown on the supporting structure 104. In one embodiment, the oxide gate dielectric layer 106 is 300 nm thick silicon dioxide ($SiO_2$). Other possible choices for the dielectric layer 106 include, but are not limited to, silicon dioxide, silicon nitride, aluminum oxide, tantalum oxide, hafnium oxide, polyimide, and polyvinylphenol.

FIG. 2C depicts the third part of the fabrication of the bottom contact thin-film transistor geometry in accordance with the present invention. A polymer composite 110 having a conducting filler is connected with the dielectric layer 106. For the example shown in FIG. 2C, the polymer composite 110 is placed on the dielectric layer. The polymer composite 110 is placed to form a contact pattern, i.e. a drain and source contact pattern. In one embodiment, the polymer composite 110 is a conductive carbon-based paste known as Flexible carbon conductor 2513 procured from Metech (Elverson, Pa.). This paste is comprised of a polyester-based polymer binder and solvent with conducting carbon particle filler, and forms a flexible conducting layer upon printing and subsequent curing (with a resistivity of less than 50 ohms per square, for a 25 micron thick layer ($\Omega$/sq.-25 $\mu$m). The paste may be stencil-printed through 200 $\mu$m wide apertures, which vary in length between 10,000 $\mu$m and 100 $\mu$m (defining the channel width), with a separation between the pairs of drain-source contacts of between 500 $\mu$m and 100 $\mu$m (defining the channel length). One skilled in the art will appreciate that other conducting fillers such as graphite, silver, gold and other conducting derivatives of carbon may be used in place of the carbon material noted herein. A 125 $\mu$m thick laser cut stainless steel stencil, procured from Metal Etching Technology (Mt. Holly, N.J.), was used to form the drain and source contact patterns.

In one embodiment, the polymer composite 110 was stencil-printed through the apertures using a metal squeegee, and then the polymer composite 110 was cured at 100° C. on a hot plate for 30 minutes.

Optionally, the polymer composite 110 and the underlying dielectric layer 106 is treated with hexamethyldisilazane (HMDS) using spin-coating at 2000 revolutions per minute (rpm) for 20 seconds.

Referring back to FIG. 1, an organic semiconductor layer 108 is formed over the polymer composite 110 and the dielectric layer 106. In one embodiment, the organic semiconductor layer 108 is formed from by dissolving an organic semiconductor, i.e. 0.038 grams of regioregular poly(3-hexylthiophene), commercially known as P3HT from Sigma-Aldrich (St. Louis, Mo.) in 10 milliliters of a solvent, i.e., toluene, forming a semiconductor solution. Toluene was chosen because the polymer composite 110 contacts did not appear to be dissolved or significantly swelled by this solvent. One skilled in the art will appreciate that any number of solvents can be used in place of toluene, such as xylenes, as well as other suitable aromatic and aliphatic solvents.

The solution is optionally filtered through a 0.2 $\mu$m polytetrafluoroethylene (PTFE) syringe-filter and then deposited over at least a portion of the polymer composite 110. In one embodiment, the solution is drop-cast from the syringe onto the surface of the polymer composite 110 and the dielectric layer 106. The solvent is evaporated from the semiconductor solution, forming the P3HT layer. The layer was then dried under vacuum for 18 hours, to remove trace amounts of solvent. In one embodiment, the organic semiconductor layer 108 provides an electrical connection between a first portion and a second portion of the contact pattern formed by the polymer composite 110, i.e. the organic semiconductor layer 108 provides a channel between the drain and source contacts formed by the polymer composite 110.

A device manufactured as described above, was then tested to determine its characteristics and properties. For testing purposes, a gate contact 102 was made to the cleaved wafer 104. In one embodiment, the contact was made by metallic tape. Contact was made to the drain and source polymer composite 110 contacts through probes connected to micromanipulators. Adhesion of the polymer composite 110 contacts with respect to probing was very good. Device measurements were conducted on an HP 4145B Semiconductor Parameter Analyzer from Agilent (Palo Alto, Calif.), with the drain-source voltage swept from 0 to −100 Volts, and the gate bias varying from 0 to −100 Volts (in −10 Volt steps).

Figure 3:
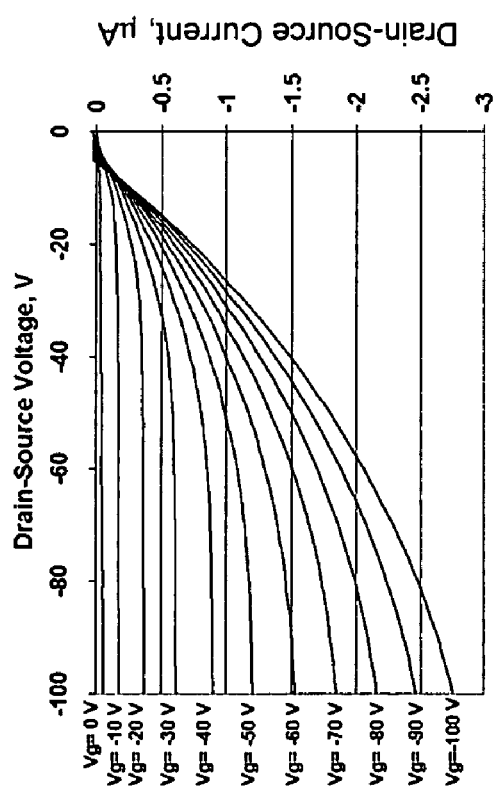
FIG. 3 depicts output characteristics from a device fabricated in accordance with the present invention.

FIG. 3 depicts output characteristics from a device fabricated as discussed above. The x-axis is the drain-source voltage in Volts and the y-axis is the drain-source current in microamps ($\mu$A). Each curve on the graph represents the data taken at a different gate Voltage $V_g$. The output characteristics show a clear field-effect enhancement with increasing gate bias. This demonstrates the effectiveness of the polymer composite 110 contacts. The device tested had a channel length of 500 $\mu$m and a channel width of 5,000 $\mu$m. One skilled in the art will appreciate that smaller device geometries are possible, as printed feature sizes down to 37 $\mu$m have been demonstrated using micro-screen printing techniques, such as those disclosed in R. D. Shipton, C. J. Robertson, D. R. Gray et al., "Ultra-Fine Thick Film Printing with Foil Based $\mu$-Screens, Advancing Microelectronics, Vol. 29, July/August, 2002, incorporated herein by reference. Also, other techniques such as ink jet printing could be used to achieve finer line widths and spacings.

As previously discussed, enhancement of the drain-source current, $I_{ds}$ is clearly seen as a function of increasing gate bias, $V_g$, in FIG. 3. An on/off current ratio, $I_{on}/I_{off}$, of 45 was determined at Drain-Source Voltage, $V_{ds}$, equal to −100 Volts, with $V_g$=0 Volts ($I_{off}$) and $V_g$=−100 Volts ($I_{on}$).

Figure 4:
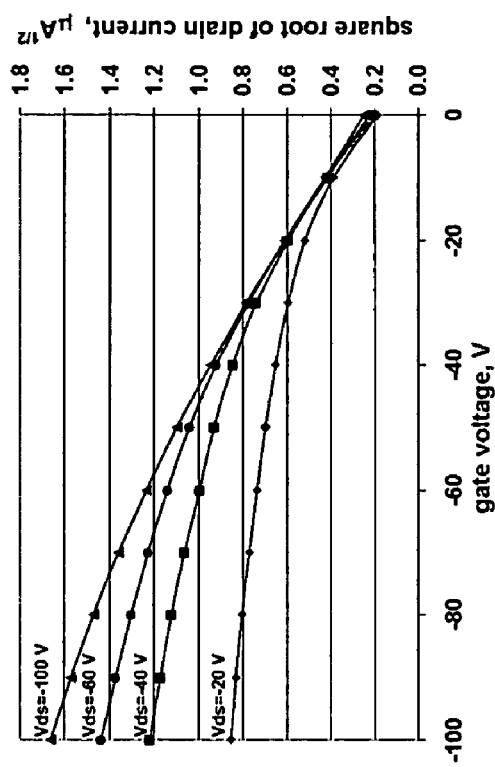
FIG. 4 depicts the square root of the drain current in $\mu A^{1/2}$ vs. gate Voltage, Vg, at several drain-source voltages, $V_{ds}$, of a device fabricated in accordance with the present invention.

FIG. 4 depicts the square root of the drain current in $\mu A^{1/2}$ vs. gate Voltage, Vg, at several drain-source voltages, $V_{ds}$. A field-effect mobility of $\mu \approx 0.007$ centimeters squared per volt-second ($cm^2/V$-s) was estimated from the data (from the slope of the $V_{ds}$=−100 V curve over the range of $V_g$=0 V to −50 V using an oxide capacitance of $C_{ox}$=1.2×10$^{-8}$ farads per centimeter squared ($F/cm^2$) by extraction from eq. 1.

$$I_D = \frac{W}{2L}\mu C_{ox}(V_G - V_T)^2, \qquad \text{eq. 1}$$

where $I_D$ is the drain current, W is the channel width equal to 5,000 $\mu$m, L is the channel length equal to 500 $\mu$m, $V_G$ is the gate voltage and $V_T$ is the threshold voltage.

The values shown in FIGS. 3 and 4 are in line with similar devices reported in the literature using gold contacts with the P3HT polymer cast from toluene onto a silicon dioxide gate dielectric layer (with μ≈0.004 cm²/V-s and $I_{on}/I_{off}$=25). For an example of device characteristics for devices using gold contacts with P3HT polymer see Z. Bao, A. Dodabulapur, k and A. J. Lovinger, Applied Physics Letters, vol. 69, pg. 4108, 1996, herein incorporated by reference.

While the above processes and data are associated with a bottom contact device, one skilled in the art will appreciate that a top contact device may also be fabricated using the same ideas disclosed herein. For example, FIGS. 5A-5E depict one process by which a top contact device may be fabricated in accordance with the present invention.

FIG. 5A depicts the first part of the fabrication of a top contact thin-film transistor geometry in accordance with the present invention. The first part includes a supporting structure 502. In one embodiment a supporting structure 502 is a highly boron-doped silicon wafer with a resistivity of 0.001-0.005 Ω-cm, which was procured from Virginia Semiconductor (Fredericksburg, Va.). The wafer acts not only as a supporting structure 502, but also provides the gate contact 503 to the dielectric by virtue of its low resistivity. This supporting structure could also be comprised of other rigid materials such as glass or a ceramic, or could be a flexible substrate such as a polyester or a polyimide-based material. When non-conducting support structures such as these are employed, a metallized gate contact would need to be added.

FIG. 5B depicts the second part of the fabrication of the top contact thin-film transistor geometry. An oxide gate dielectric layer 504 is deposited or grown on the supporting structure 502. In one embodiment, the oxide gate dielectric layer 504 is 300 nm thick silicon dioxide ($SiO_2$). Other possible choices for the dielectric layer 106 include, but are not limited to, silicon dioxide, silicon nitride, aluminum oxide, tantalum oxide, hafnium oxide, polyimide, and polyvinylphenol.

FIG. 5C depicts the third part of the fabrication of the top contact thin-film transistor geometry in accordance with the present invention. An organic semiconductor layer 506 is formed over the dielectric layer 504. In one embodiment, the organic semiconductor layer 506 is formed by dissolving an organic semiconductor in a solvent.

FIG. 5D depicts the fourth part of the fabrication of the top contact thin-film transistor geometry in accordance with the present invention. A polymer composite 508 having a conducting filler is connected with the dielectric layer 504 by being placed over a portion of the organic semiconductor layer 506. One skilled in the art will appreciate that the polymer composite 508 may be deposited in an atmosphere, and not in a vacuum as is required for sputtering and vacuum deposition techniques. The polymer composite 508 is placed to form a contact pattern, i.e. a drain and source contact pattern. In one embodiment, the polymer composite 508 is a conductive carbon-based paste known as Flexible carbon conductor 2513 procured from Metech (Elverson, Pa.). This paste is comprised of a polyester-based polymer binder and solvent with conducting carbon particle filler, and forms a flexible conducting layer upon printing and subsequent curing (with a resistivity of less than 50 ohms per square, for a 25 micron thick layer (Ω/sq.-25 μm). The paste may be stencil-printed through 200 μm wide apertures, which vary in length between 10,000 μm and 100 μm (defining the channel width), with a separation between the pairs of drain-source contacts of between 500 μm and 100 μm (defining the channel length). One skilled in the art will appreciate that other conducting fillers such as graphite, silver, gold and other conducting derivatives of carbon may be used in place of the carbon material noted herein. A 125 μm thick laser cut stainless steel stencil, procured from Metal Etching Technology (Mt. Holly, N.J.), was used to form the drain and source contact patterns.

In one embodiment, the polymer composite 508 was stencil-printed through the apertures using a metal squeegee, and then the polymer composite 508 was cured at 100° C. on a hot plate for 30 minutes.

One skilled in the art will appreciate that the choice of the organic semiconductor material 506 and the polymer composite 508 are interrelated. For optimal performance, the semiconductor material, the solvent in which the semiconductor material is dissolved, the polymer composite, and the solvent in which the polymer composite is mixed should be chosen so that they do not cause the dissolution or breakdown of each other. For example, in the case of the bottom-contact geometry, the polymer composite is placed first, followed by the organic semiconductor; therefore, the solvent in which the organic semiconductor is dissolved should be chosen such that this solvent does not also dissolve the polymer composite. In the case of the top-contact geometry, the organic semiconductor is placed first, followed by the polymer composite; therefore, the solvent in which the polymer composite is mixed should be chosen such that it does not also dissolve the organic semiconductor.

What is claimed is:

1. A method of forming an active device comprising acts of:
   depositing a dielectric layer on a substrate;
   placing a polymer composite over at least a portion of the dielectric layer in an atmosphere to form drain and source contacts, the polymer composite having a conducting filler; and
   forming an organic semiconductor layer over at least a portion of the polymer composite, the organic semiconductor layer providing a channel between the drain and source contacts.

2. The method of claim 1, wherein the act of forming an organic semiconductor layer further comprises acts of:
   dissolving an organic semiconductor in a solvent forming a semiconductor solution;
   depositing the semiconductor solution over at least a portion of the polymer composite; and
   evaporating the solvent from the semiconductor solution such that the organic semiconductor layer remains.

3. An active device produced by the process of claim 1.

4. A method of forming a flexible contact comprising acts of:
   forming a first contact pattern on a supporting structure;
   depositing a dielectric layer on the supporting structure;
   depositing a polymer composite having a conducting filler to form a second contact pattern connected with the dielectric layer; wherein the second contact pattern is deposited using a solution-based process; and
   providing an organic semiconductor layer for connecting a first portion of the second contact pattern with a second portion of the second contact pattern; wherein the organic semiconductor layer is formed using a solution-based process.

5. The method of claim 4, wherein the act depositing a dielectric layer includes an act of selecting a dielectric material from a group consisting of: silicon dioxide, silicon nitride, aluminum oxide, tantalum oxide, hafnium oxide, polyimide, and polyvinylphenol.

6. The method of claim 4, wherein the depositing a polymer composite is performed by a printing technique selected from: stencil printing, and inkjet printing.

7. The method of claim 4, wherein the act of depositing a polymer composite is performed with the conducting filler selected from a group consisting of: graphite, silver, carbon, conducting derivatives of carbon, and gold.

8. The method of claim 4, wherein the act of providing an organic semiconductor layer further comprise acts of:
dissolving an organic semiconductor in a solvent forming a semiconductor solution;
depositing the semiconductor solution over at least a portion of the polymer composite; and
evaporating the solvent of the semiconductor solution such that the organic semiconductor layer remains.

9. The method of claim 8, wherein the act of dissolving is performed with a solvent selected from a group consisting of: toluene, xylenes, aromatic solvents, and aliphatic solvents.

10. The method of claim 4, wherein the act of depositing a polymer composite is performed in an atmosphere.

11. The method of claim 4, wherein the acts of depositing a polymer composite and providing an organic semiconductor layer are performed in an order selected from a group consisting of: first depositing the polymer composite, then providing the organic semiconductor layer, and first providing the organic semiconductor layer, then depositing the polymer composite.

12. A flexible contact produced by the process of claim 4.

13. A flexible ohmic contact comprising:
a supporting structure including a first contact pattern;
a dielectric layer disposed on the supporting structure;
a polymer composite deposited in an atmosphere and connected with the dielectric layer, the polymer composite providing a second contact pattern, the second contact pattern having a first portion and a second portion, where the first portion and the second portion are separated by a distance; and
an organic semiconductor layer connected with the dielectric layer, the organic semiconductor layer allowing for an electrical connection between the first portion and the second portion of the second contact pattern.

14. The flexible ohmic contact of claim 13, wherein the supporting structure is a flexible substrate.

15. The flexible ohmic contact of claim 13, wherein the dielectric layer is selected from the group consisting of: silicon dioxide, silicon nitride, aluminum oxide, tantalum oxide, hafnium oxide, polyimide, and polyvinylphenol.

16. The flexible ohmic contact of claim 13, wherein the polymer composite is a polymer thick-film ink having a conducting filler.

17. The flexible ohmic contact of claim 16, wherein the conducting filler is selected from the group consisting of: graphite, silver, carbon, conducting derivatives of carbon and gold.

18. The flexible ohmic contact of claim 13, wherein the polymer composite is disposed with respect to the dielectric layer by stencil printing or inkjet printing.

19. The flexible ohmic contact of claim 13, wherein the organic semiconductor layer is connected with the dielectric layer by placing the organic semiconductor layer on a portion of the dielectric layer in solution form, wherein a portion of the solution is evaporated leaving the organic semiconductor layer.

20. The flexible ohmic contact of claim 13, wherein at least a portion of a thickness of the organic semiconductor layer lies between the polymer composite and the dielectric layer.

21. A method of forming a flexible contact comprising acts of:
forming a first contact pattern on a supporting structure;
depositing a dielectric layer on the supporting structure;
depositing a polymer composite having a conducting filler to form a second contact pattern connected with the dielectric layer; wherein the act of depositing the polymer composite is performed by a printing technique selected from: stencil printing and inkjet printing; and
providing an organic semiconductor layer for connecting a first portion of the second contact pattern with a second portion of the second contact pattern.

22. A method of forming a flexible contact comprising acts of:
forming a first contact pattern on a supporting structure;
depositing a dielectric layer on the supporting structure;
depositing a polymer composite having a conducting filler to form a second contact pattern connected with the dielectric layer; wherein the act of depositing the polymer composite is performed with the conducting filler selected from a group consisting of: graphite, silver, carbon, conducting derivatives of carbon, and gold; and
providing an organic semiconductor layer for connecting a first portion of the second contact pattern with a second portion of the second contact pattern.

23. A method of forming a flexible contact comprising acts of:
forming a first contact pattern on a supporting structure;
depositing a dielectric layer on the supporting structure;
depositing a polymer composite from solution having a conducting filler to form a second contact pattern connected with the dielectric layer; wherein the act of depositing the polymer composite is performed in an atmosphere; and
providing an organic semiconductor layer from solution for connecting a first portion of the second contact pattern with a second portion of the second contact pattern.

24. A flexible ohmic contact comprising:
a supporting structure including a first contact pattern;
a dielectric layer disposed on the supporting structure;
a polymer composite connected with the dielectric layer, the polymer composite providing a second contact pattern, the second contact pattern having a first portion and a second portion, where the first portion and the second portion are separated by a distance; and wherein the polymer composite is a polymer thick-film ink having a conducting filler; and
an organic semiconductor layer connected with the dielectric layer, the organic semiconductor layer allowing for an electrical connection between the first portion and the second portion of the second contact pattern.

25. The flexible ohmic contact of claim 24, wherein the conducting filler is selected from the group consisting of: graphite, silver, carbon, conducting derivatives of carbon and gold.

26. A flexible ohmic contact comprising:
a supporting structure including a first contact pattern;
a dielectric layer disposed on the supporting structure;
a polymer composite connected with the dielectric layer, the polymer composite providing a second contact pattern, the second contact pattern having a first portion and a second portion, where the first portion and the second portion are separated by a distance; and wherein the polymer composite is disposed with respect to the dielectric layer by stencil printing or inkjet printing; and an organic semiconductor layer connected with the dielectric layer, the organic semiconductor layer allowing for an electrical connection between the first portion and the second portion of the second contact pattern.

27. The method of claim 1, wherein the drain and source contacts are deposited using a solution-based process; and wherein the organic semiconductor layer is formed using a solution-based process.

* * * * *